US011121733B2

(12) United States Patent
Naniwa et al.

(10) Patent No.: US 11,121,733 B2
(45) Date of Patent: Sep. 14, 2021

(54) SEMICONDUCTOR DEVICE, RADIO-FREQUENCY CIRCUIT, AND COMMUNICATION APPARATUS

(71) Applicant: Murata Manufacturing Co., Ltd., Kyoto (JP)

(72) Inventors: Yusuke Naniwa, Kyoto (JP); Hideki Muto, Kyoto (JP); Yukiya Yamaguchi, Kyoto (JP); Shun Harada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/831,929

(22) Filed: Mar. 27, 2020

(65) Prior Publication Data
US 2020/0228151 A1 Jul. 16, 2020

Related U.S. Application Data

(63) Continuation of application No. PCT/JP2018/034212, filed on Sep. 14, 2018.

(30) Foreign Application Priority Data

Sep. 29, 2017 (JP) .............................. JP2017-192158
Apr. 20, 2018 (JP) .............................. JP2018-081302

(51) Int. Cl.
*H04B 1/04* (2006.01)
*H01L 23/66* (2006.01)
*H04B 1/44* (2006.01)

(52) U.S. Cl.
CPC .......... *H04B 1/0475* (2013.01); *H01L 23/66* (2013.01); *H04B 1/0458* (2013.01); *H04B 1/44* (2013.01)

(58) Field of Classification Search
CPC .......... H04B 1/005; H04B 1/006; H04B 1/04; H04B 1/16; H04B 1/40; H04B 1/44; H04B 2001/0408
See application file for complete search history.

(56) References Cited

U.S. PATENT DOCUMENTS 9,515,615 B2 * 12/2016 Ichitsubo ............... H04B 1/006
10,643,962 B1 * 5/2020 Ichitsubo ................. H03F 3/24
(Continued)

FOREIGN PATENT DOCUMENTS

CN 107026657 A 8/2017
JP H10-79467 A 3/1998
(Continued)

OTHER PUBLICATIONS

International Search Report issued in Application No. PCT/JP2018/034212, dated Nov. 27, 2018.
(Continued)

Primary Examiner — Blane J Jackson
(74) Attorney, Agent, or Firm — Pearne & Gordon LLP

(57) ABSTRACT

A semiconductor device includes a base, a first switching unit disposed on the base, the first switching unit having a substantially rectangular shape and including plural first switches, and an amplifier unit disposed on the base, the amplifier unit including plural amplifier circuits to which a radio-frequency signal is inputted after passing through the first switching unit. In plan view of the base, the first switching unit has four edges including a first edge, a second edge orthogonal to the first edge, and a third edge parallel to the first edge and orthogonal to the second edge, the amplifier unit includes a first region extending along the first edge, a second region extending along the second region, and a third region extending along the third edge, and at least one
(Continued)

of the plural amplifier circuits is disposed in each of the first region, the second region, and the third region.

20 Claims, 9 Drawing Sheets

(56) References Cited

U.S. PATENT DOCUMENTS

| | | | | |
|---|---|---|---|---|
| 2004/0232982 | A1* | 11/2004 | Ichitsubo | H03G 3/3042 |
| | | | | 330/129 |
| 2010/0091752 | A1* | 4/2010 | Kemmochi | H03H 7/09 |
| | | | | 370/339 |
| 2012/0176199 | A1 | 7/2012 | Umeda | |
| 2014/0235184 | A1* | 8/2014 | Ichitsubo | H04B 1/0067 |
| | | | | 455/101 |
| 2014/0308907 | A1* | 10/2014 | Chen | H01L 23/49838 |
| | | | | 455/90.3 |
| 2017/0194993 | A1 | 7/2017 | Watanabe | |
| 2018/0091187 | A1 | 3/2018 | Uejima | |

FOREIGN PATENT DOCUMENTS

| | | |
|---|---|---|
| JP | 2005-136883 A | 5/2005 |
| JP | 2006-319512 A | 11/2006 |
| JP | 2007-180643 A | 7/2007 |
| JP | 2011-254382 A | 12/2011 |
| WO | 2016-194924 A1 | 12/2016 |

OTHER PUBLICATIONS

Written Opinion issued in Application No. PCT/JP2018/034212, dated Nov. 27, 2018.
Office Action for Korean Patent Application No. 10-2020-7000967 dated Jul. 23, 2021.

* cited by examiner

SEMICONDUCTOR DEVICE, RADIO-FREQUENCY CIRCUIT, AND COMMUNICATION APPARATUS

This is a continuation of International Application No. PCT/JP2018/034212 filed on Sep. 14, 2018 which claims priority from Japanese Patent Application No. 2017-192158 filed on Sep. 29, 2017, and claims priority from Japanese Patent Application No. 2018-081302 filed on Apr. 20, 2018. The contents of these applications are incorporated herein by reference in their entireties.

BACKGROUND OF THE DISCLOSURE

1. Field of the Disclosure

The present disclosure relates to a semiconductor device, a radio-frequency circuit, and a communication apparatus.

2. Description of the Related Art

The recent trend toward smaller sizes of mobile communication devices or other such devices has led to higher integration of components incorporated in front-end modules. For example, a semiconductor device with an amplifier circuit, a control circuit, and a switch integrated on the same semiconductor substrate has been disclosed (see, for example, Japanese Unexamined Patent Application Publication No. 10-079467).

Requirements for modern mobile communication devices or other such devices include, in addition to miniaturization, the capability to support plural frequency bands and plural radio systems by means of a single terminal, in other words, multiband and multimode capability. Front-end modules designed for multiband and multimode operation are required to process plural radio-frequency signals without degradation of signal quality. Examples of requirements for such front-end modules include improved isolation between transmission paths for the radio-frequency signals, and reduced path loss between these paths. However, increasingly higher integration of components has led to more complex routing of interconnections between components inside the substrate. The increased routing complexity makes it difficult to improve isolation characteristics, and also leads to increased interconnection lengths and consequently greater path loss.

BRIEF SUMMARY OF THE DISCLOSURE

Accordingly, it is an object of the present disclosure to provide a semiconductor device, a radio-frequency circuit, and a communication apparatus that are capable of reducing path loss while improving isolation characteristics.

According to preferred embodiments of the present disclosure, there is provided a semiconductor device including a base, a first switching unit, and an amplifier circuit. The first switching unit is disposed on the base. The first switching unit has a substantially rectangular shape, and includes a plurality of first switches. The amplifier unit is disposed on the base, and includes a plurality of amplifier circuits to which a radio-frequency signal is inputted after passing through the first switching unit. In a plan view of the base, the first switching unit has four edges including a first edge, a second edge orthogonal to the first edge, and a third edge parallel to the first edge and orthogonal to the second edge, the amplifier unit includes a first region extending along the first edge, a second region extending along the second region, and a third region extending along the third edge, and at least one of the plurality of amplifier circuits is disposed in each of the first region, the second region, and the third region.

As a result of the above-mentioned configuration, for the semiconductor device in which a radio-frequency signal flows through the first switching unit and the amplifier unit in this order, if the first switching unit and the amplifier unit are to be connected via another component, the interconnection line connecting the first switching unit with the other component, and the interconnection line connecting the other component with the amplifier unit can be shortened. This helps reduce the path loss in the semiconductor device.

Further, individual interconnection lines for the semiconductor device can be shortened. This helps simplify the routing of individual interconnection lines, and facilitate a design such that the interconnection lines for individual radio-frequency paths do not overlap in a plan view of the base. Therefore, the isolation characteristics of the semiconductor device can be improved.

According to preferred embodiments of the present disclosure, there is provided a radio-frequency circuit including a substrate, the semiconductor device mentioned above, a first matching circuit unit, a filtering unit, and a second matching circuit unit. The substrate has a first major side and a second major side. The semiconductor device is disposed over the first major side of the substrate or inside the substrate. The first matching circuit unit is disposed over the second major side of the substrate, and includes a plurality of first matching circuits. The filtering unit is disposed at a position over the second major side of the substrate and closer to an outer side portion of the substrate than the first matching circuit unit in a plan view. The filtering unit includes at least one filter. The second matching circuit unit is disposed at a position over the second major side of the substrate and closer to the outer side portion of the substrate than the filtering unit in a plan view. The second matching circuit unit includes at least one second matching circuit. A radio-frequency signal passes through the first switching unit, the first matching circuit unit, the filtering unit, the second matching circuit unit, and the amplifier unit in this order. In a plan view of the second major side, the distance between the center of the semiconductor device and the first matching circuit unit is shorter than the distance between the center of the semiconductor device and the filtering unit, and the distance between the center of the semiconductor device and the first matching circuit unit is shorter than the distance between the center of the semiconductor device and the second matching circuit unit.

As a result of the above-mentioned configuration, for the radio-frequency circuit in which a radio-frequency signal flows through the first switching unit, the first matching circuit unit, the filtering unit, the second matching circuit unit, and the amplifier unit in this order, if the first switching unit and the amplifier unit that constitute the semiconductor device are to be connected via the first matching circuit unit, the filtering unit, and the second matching circuit unit, the interconnection line connecting the first switching unit with the first matching circuit unit, and the interconnection line connecting the second matching circuit unit with the amplifier unit can be shortened. This helps reduce the path loss from the first switching unit to the amplifier unit in the radio-frequency circuit.

According to preferred embodiments of the present disclosure, in a plan view of the second major side, the distance between the center of the semiconductor device and the filtering unit is shorter than the distance between the center of the semiconductor device and the second matching circuit unit.

The above-mentioned configuration makes it possible to further shorten the interconnection line connecting the second matching circuit unit with the amplifier unit.

According to preferred embodiments of the present disclosure, the semiconductor device includes a third major side and a fourth major side, and a first terminal and a second terminal. The third and fourth major sides are parallel to the second major side and opposite to each other, and the fourth major side is closer to the second major side than the third major side. The first and second terminals are disposed on the fourth major side. The first terminal is connected to the first switching unit, and connected to the first matching circuit unit. The second terminal is connected to the amplifier unit, and connected to the second matching circuit unit. In a plan view of the fourth major side, the distance between the center of the semiconductor device and the first terminal is shorter than the distance between the center of the semiconductor device and the second terminal.

As a result of the above-mentioned configuration, the interconnection line connecting the first switching unit with the first matching circuit unit is positioned closer to the center of the semiconductor device than the interconnection line connecting the amplifier unit with the second matching circuit unit. As a result, the above-mentioned two interconnection lines can be formed in the same manner as the flow of a radio-frequency signal from the first switching unit to the amplifier unit. The two interconnection lines can be thus shortened. Further, the above-mentioned configuration makes it possible to eliminate the crossing of the two interconnection lines in the above-mentioned plan view, thus minimizing the parasitic capacitance formed by the two interconnection lines.

According to preferred embodiments of the present disclosure, the semiconductor device further includes a second switching unit, a third switching unit, and a third terminal. The second switching unit is disposed on the base, and includes a plurality of second switches to which the radio-frequency signal is inputted after passing through the amplifier unit. The third switching unit is disposed on the base, and includes a plurality of third switches to which the radio-frequency signal is inputted after passing through the filtering unit. The plurality of third switches each output the input radio-frequency signal to the second matching circuit unit. The third terminal is disposed on the fourth major side. The third terminal is connected to the third switching unit, and connected to the second matching circuit unit. In a plan view of the fourth major side, the distance between the center of the semiconductor device and the third terminal is shorter than the distance between the center of the semiconductor device and the second terminal.

As a result of the above-mentioned configuration, the interconnection line connecting the third switching unit with the second matching circuit unit is positioned closer to the center of the semiconductor device than the interconnection line connecting the amplifier unit with the second matching circuit unit. As a result, the above-mentioned two interconnection lines can be formed in the same manner as the flow of a radio-frequency signal from the first switching unit to the amplifier unit. The two interconnection lines can be thus shortened. Further, the above-mentioned configuration makes it possible to eliminate the crossing of the two interconnection lines in the above-mentioned plan view, thus minimizing the parasitic capacitance formed by the two interconnection lines.

Further, each individual interconnection line placed between the first switching unit and the second switching unit can be shortened. This can simplify the routing of individual interconnection lines, thus facilitating a design such that the interconnection lines for individual radio-frequency paths do not overlap in a plan view of the substrate. Therefore, the isolation characteristics of the radio-frequency circuit can be improved.

According to preferred embodiments of the present disclosure, a ground pattern is disposed inside the substrate, and the ground pattern is positioned to overlap the second matching circuit unit in a plan view and is not disposed within a region located closer to the second major side than a position corresponding to substantially one-half of the thickness of the substrate.

As a result, in the area under the second matching circuit unit connected to the amplifier unit, the parasitic capacitance that forms between the ground pattern and another interconnection line can be reduced. In particular, the parasitic capacitance that forms between the land of the second circuit unit connected to the amplifier unit, and the ground pattern can be reduced. The influence of phase shift and interconnection impedance can be thus reduced for a radio-frequency signal inputted to the amplifier unit. This makes it possible to reduce the degradation of the characteristics of each amplifier circuit disposed in the amplifier unit.

According to preferred embodiments of the present disclosure, the second matching circuit unit includes a first electrode and a second electrode. The second electrode is located farther from the filter than the first electrode. The second electrode is connected to the filter.

The above-mentioned configuration makes it possible to shorten the interconnection line connecting the second matching circuit unit with the amplifier unit provided to the semiconductor device. This helps reduce the parasitic capacitance in the interconnection line between the amplifier unit and the second matching circuit unit. The influence of phase shift and interconnection impedance can be thus reduced for a radio-frequency signal inputted to the amplifier unit. This makes it possible to further reduce the degradation of the characteristics of each amplifier circuit disposed in the amplifier unit.

According to preferred embodiments of the present disclosure, among the first switching unit, the first matching circuit unit, the filtering unit, the second matching circuit unit, and the amplifier unit, the first matching circuit unit, the filtering unit, and the second matching circuit unit are disposed over the second major side, and the first switching unit, and the amplifier unit are disposed over the first major side.

Consequently, analog and digital circuit components are spaced apart from each other by at least a distance substantially equal to the thickness of the substrate. This configuration helps prevent the digital noise generated by a digital circuit component from leaking into an analog circuit component.

According to preferred embodiments of the present disclosure, the first matching circuit unit includes a first inductor and a second inductor. The first inductor and the second inductor are disposed adjacent to each other over the second major side. The first inductor is mounted over the second major side with the coil axis of the first inductor being parallel to the second major side. The second inductor is mounted over the second major side with the coil axis of the second inductor being perpendicular to the second major side.

The above-mentioned configuration helps reduce the leaking-in of an undesired signal, intermodulation distortion, or other problems caused by electromagnetic coupling, thus making it possible to reduce the degradation of the characteristics of the front-end module such as noise figure.

According to preferred embodiments of the present disclosure, the semiconductor device includes a digital circuit component, and the substrate includes a first ground pattern to which an analog circuit component is connected, and a second ground pattern to which the digital circuit component is connected. The first ground pattern and the second ground pattern are connected only by a conductor connected to a ground terminal.

With the above-mentioned configuration, the ground for the analog circuit component, and the ground for the digital circuit component are separated from each other, and the ground for the digital circuit component is positioned close to the reference ground terminal. This helps further prevent the digital noise generated by the digital circuit component from leaking into the analog circuit component.

According to preferred embodiments of the present disclosure, the substrate includes a plurality of ground patterns connected only by a conductor connected to a ground terminal. Each of the plurality of amplifier circuits is connected to a different one of the plurality of ground patterns.

Consequently, the ground patterns for different amplifier circuits are separated. This configuration helps ensure that, for the amplifier circuits through which radio-frequency signals in different frequency bands pass, a radio-frequency signal in one frequency band does not leak into an amplifier circuit in another frequency band. This helps reduce the degradation of the noise characteristics of each amplifier circuit.

Further, the interconnection line located closest to the back side of the substrate is connected to the ground terminal to serve as a ground pattern. This helps prevent the noise or other interferences from leaking into each amplifier circuit via the ground pattern.

According to preferred embodiments of the present disclosure, there is provided a communication apparatus including a radio-frequency integrated circuit (RFIC) that processes a radio-frequency signal sent and received by an antenna element, and the above-mentioned radio-frequency circuit that transmits the radio-frequency signal between the antenna element and the RFIC.

The above-mentioned configuration makes it possible to provide a communication apparatus with the improved isolation characteristics and the reduced path loss.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
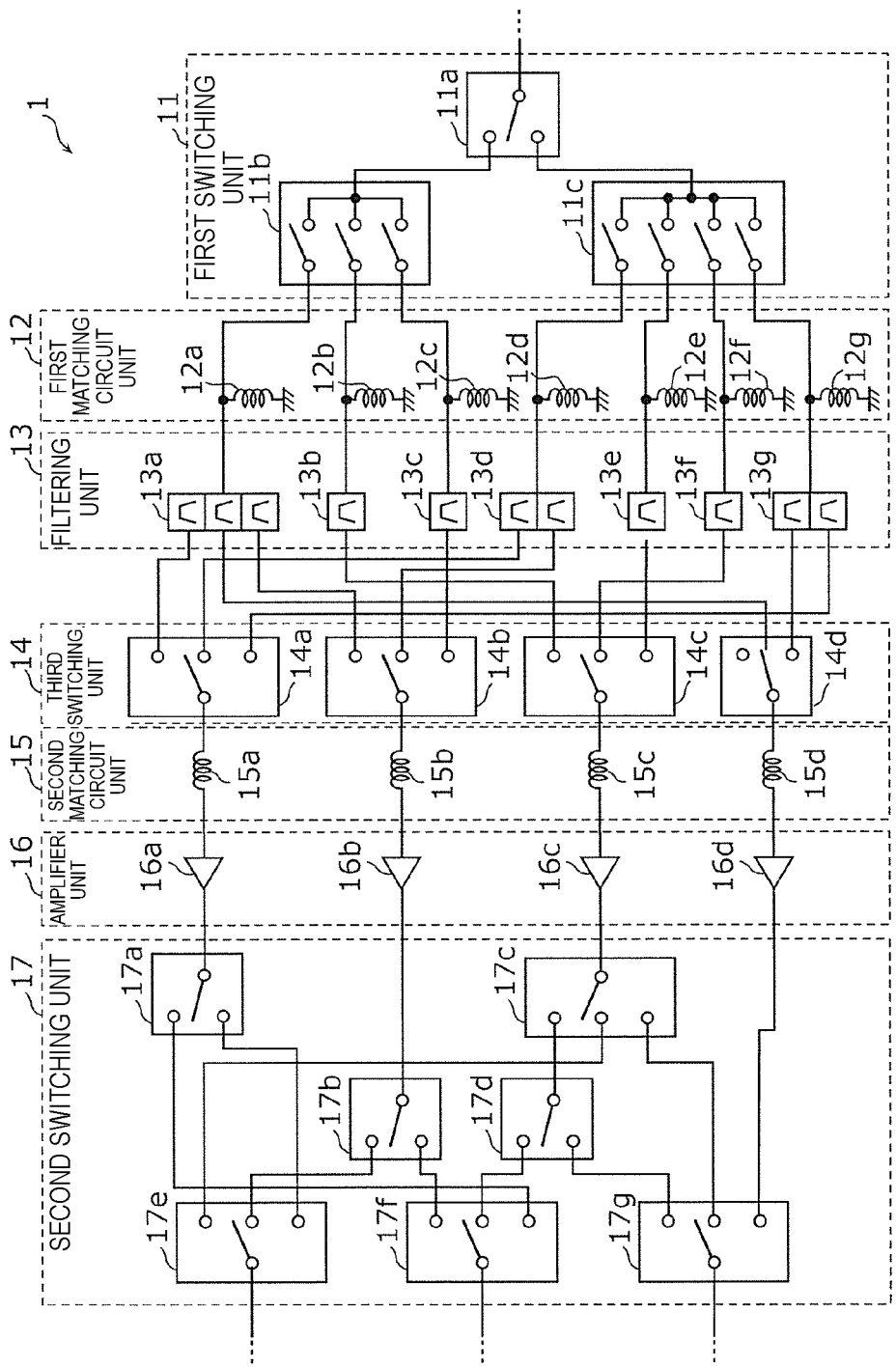
FIG. 1 is a circuit diagram of a front-end module according to Embodiment 1.

The present disclosure will be described in detail below with reference to the embodiments and the drawings. The embodiments described below each represent generic or specific examples. Features presented in the following embodiments, such as numerical values, shapes, materials, components, and the placement and connection of components, are illustrative only and not intended to be limiting of the present disclosure. Of the components illustrated in the following embodiments, those components not described in the independent claim representing the broadest concept of the present disclosure will be described as optional components. The sizes of the components illustrated in the drawings may not necessary be drawn to scale. Throughout the drawings, identical reference signs are used to designate substantially identical elements, and repetitive description will be sometimes omitted or simplified.

Embodiment 1

1. Circuit Configuration of Front-End Module

FIG. 1 is a circuit diagram of a front-end module 1, which is a radio-frequency circuit according to Embodiment 1.

The front-end module 1 is, for example, a module disposed at the front-end section of a cellular phone capable of multimode/multiband operation. The front-end module 1 is incorporated in, for example, a multiband-capable cellular phone compliant with a communication standard such as Long Term Evolution (LTE). The front-end module 1 includes plural paths (radio-frequency paths) along which plural radio-frequency signals in different bands of frequencies are transmitted.

As illustrated in FIG. 1, the front-end module 1 includes a first switching unit 11, a first matching circuit unit 12, a filtering unit 13, a third switching unit 14, a second matching circuit unit 15, an amplifier unit 16, and a second switching unit 17. Although described later in more detail, the first switching unit 11, the second switching unit 17, the third switching unit 14, and the amplifier unit 16 constitute a switching IC 10, which is a semiconductor device.

Each radio-frequency path is a path along which a radio-frequency signal passes through the switching IC 10, the filtering unit 13, the third switching unit 14, and the second matching circuit unit 15. The radio-frequency signal flows through the first switching unit 11, the third switching unit 14, the amplifier unit 16, and the second switching unit 17 in this order. More specifically, the radio-frequency signal passes through the first switching unit 11, the filtering unit 13, the third switching unit 14, the second matching circuit unit 15, the amplifier unit 16, and the second switching unit 17 in this order.

The input terminal of the first switching unit 11 is connected to, for example, an antenna element. The output terminal of the first switching unit 11 is connected with the input terminal of the filtering unit 13. The first switching unit 11 includes switches 11a to 11c to separate a radio-frequency signal received by the antenna element into radio-frequency paths corresponding to individual filters 13a to 13g that constitute the filtering unit 13.

The first matching circuit unit 12 includes, for example, inductors 12a to 12g. Each of the inductors 12a to 12g is a circuit element for providing the impedance matching between the first switching unit 11 and the filtering unit 13. Each of the inductors 12a to 12g is connected at one end to a path connecting the corresponding one of the switches 11a to 11c of the first switching unit 11 with the corresponding one of the filters 13a to 13g of the filtering unit 13, and is connected at the other end to a reference terminal (ground). In the first matching circuit unit 12, each of the inductors 12a to 12g may not be connected between the above-mentioned path and ground, but may instead be connected in series with the above-mentioned path. Further, the first matching circuit unit 12 may not necessarily be a circuit made up of the inductors 12a to 12g, but may be a circuit made up of capacitors or a combination of inductors and capacitors.

The filtering unit 13 includes the filters 13a to 13g each formed as a resonator such as a surface acoustic wave (SAW) resonator, a bulk acoustic wave (BAW) resonator, or a film bulk acoustic resonator (FBAR). Alternatively, each of the filters 13a to 13g may be formed as, for example, an LC resonant circuit. In the present case, the filters 13a to 13g are each formed as a SAW resonator. This configuration allows each of the filters 13a to 13g to be formed by an interdigital transducer (IDT) electrode formed on a piezoelectric substrate, thus achieving a compact and low-profile filtering unit 13 with steep bandpass characteristics. The output terminal of the filtering unit 13 is connected with the input terminal of the third switching unit 14.

The filter 13a is, for example, a triplexer with three filters sharing a common input terminal. Each of the filters 13d and 13g is, for example, a duplexer with two filters sharing a common input terminal.

The third switching unit 14 includes switches 14a to 14d. The switches 14a to 14d each select the corresponding one of radio-frequency signals that have passed through the filters 13a to 13g, and output the selected radio-frequency signal to the second matching circuit unit 15. The respective output terminals of the switches 14a to 14d of the third switching unit 14 are connected to the input terminal of the second matching circuit unit 15. More specifically, the respective input terminals of the switches 14a to 14d are connected to the filtering unit 13, and the respective output terminals of the switches 14a to 14d are connected to inductors 15a to 15d of the second matching circuit unit 15.

The second matching circuit unit 15 includes the inductors 15a to 15d. Each of the inductors 15a to 15d is a circuit element for providing the impedance matching between the third switching unit 14 and the amplifier unit 16. The inductors 15a to 15d are respectively connected at one end to the switches 14a to 14d, and connected at the other end to amplifier circuits 16a to 16d. In the second matching circuit unit 15, each of the inductors 15a to 15d in the second matching circuit unit 15 may not be arranged in series with a path connecting the third switching unit 14 with the amplifier unit 16, but may be connected between the above-mentioned path and ground. Further, the second matching circuit unit 15 may not necessarily be a circuit made up of the inductors 15a to 15d, but may be a circuit made up of capacitors or a combination of inductors and capacitors.

The amplifier unit 16 includes the amplifier circuits 16a to 16d that each amplify a radio-frequency signal that has passed through the first switching unit 11, the first matching circuit unit 12, the filtering unit 13, the third switching unit 14, and the second matching circuit unit 15. Each of the amplifier circuits 16a to 16d is, for example, a low-noise amplifier that amplifies a radio-frequency receive signal. The input terminal of the amplifier unit 16 is connected to the second matching circuit unit 15, and the output terminal of the amplifier unit 16 is connected to the input terminal of the second switching unit 17.

The output terminal of the second switching unit 17 is connected to, for example, a radio-frequency integrated circuit (RFIC). The second switching unit 17 includes switches 17a to 17g that distribute the radio-frequency signals amplified by the amplifier unit 16 to the predetermined terminals of the RFIC.

A controller (not illustrated) provided to the front-end module 1 switches how the switches 11a to 11c constituting the first switching unit 11, the switches 17a to 17g constituting the second switching unit 17, and the switches 14a to 14d constituting the third switching unit 14 are connected.

Each of the switches 11a to 11c, 14a to 14d, and 17a to 17g is, for example, a field-effect transistor (FET) switch implemented as a GaAs or complementary metal oxide semiconductor (CMOS) device, or a diode switch.

Although the foregoing description of Embodiment 1 is directed to the case in which the front-end module 1 is a receive front-end module that receives a radio-frequency signal from an antenna or other devices, and outputs the received radio-frequency signal to the RFIC, the front-end module according to the present disclosure can also be applied to a transmit front-end module that receives a radio-frequency transmit signal output from the RFIC, and outputs the radio-frequency transmit signal to the antenna or other devices. In this case, the amplifier circuits 16a to 16d may not be low-noise amplifiers, but may be, for example, power amplifiers that each amplify a radio-frequency transmit signal. The radio-frequency transmit signal passes through the second switching unit 17, the amplifier unit 16, the second matching circuit unit 15, the third switching unit 14, the filtering unit 13, the first matching circuit unit 12, and the first switching unit 11 in this order.

2. Structures of Switching IC and Front-End Module

Figure 2A:
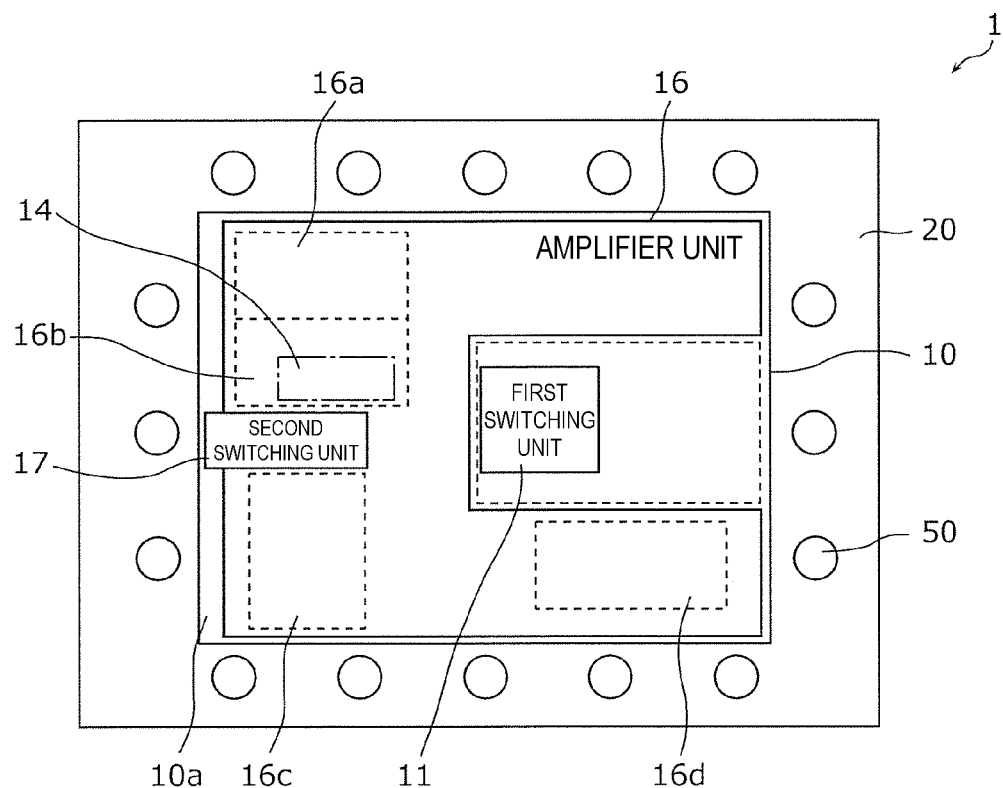
FIG. 2A is an exemplary plan view of the front-end module according to Embodiment 1 as seen from a first major side.
Figure 2B:
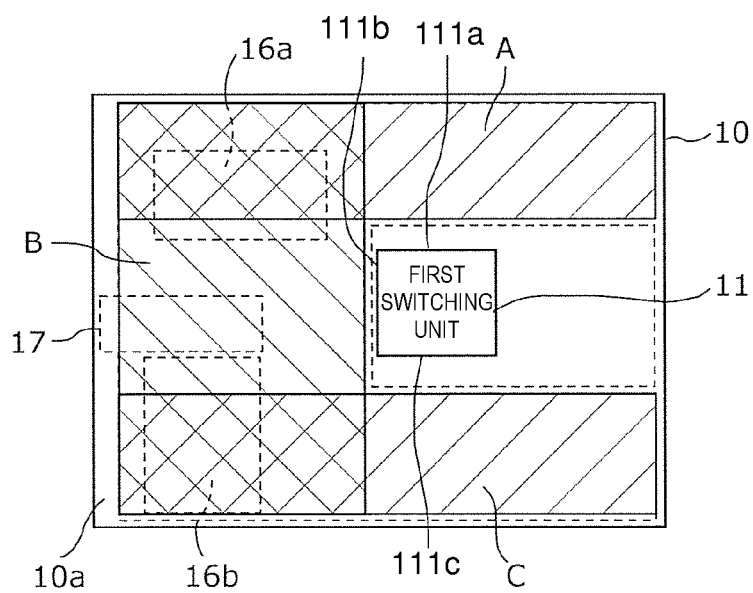
FIG. 2B is an exemplary plan view of the front-end module according to Embodiment 1, illustrating how an amplifier unit of the front-end module is positioned.
Figure 2C:
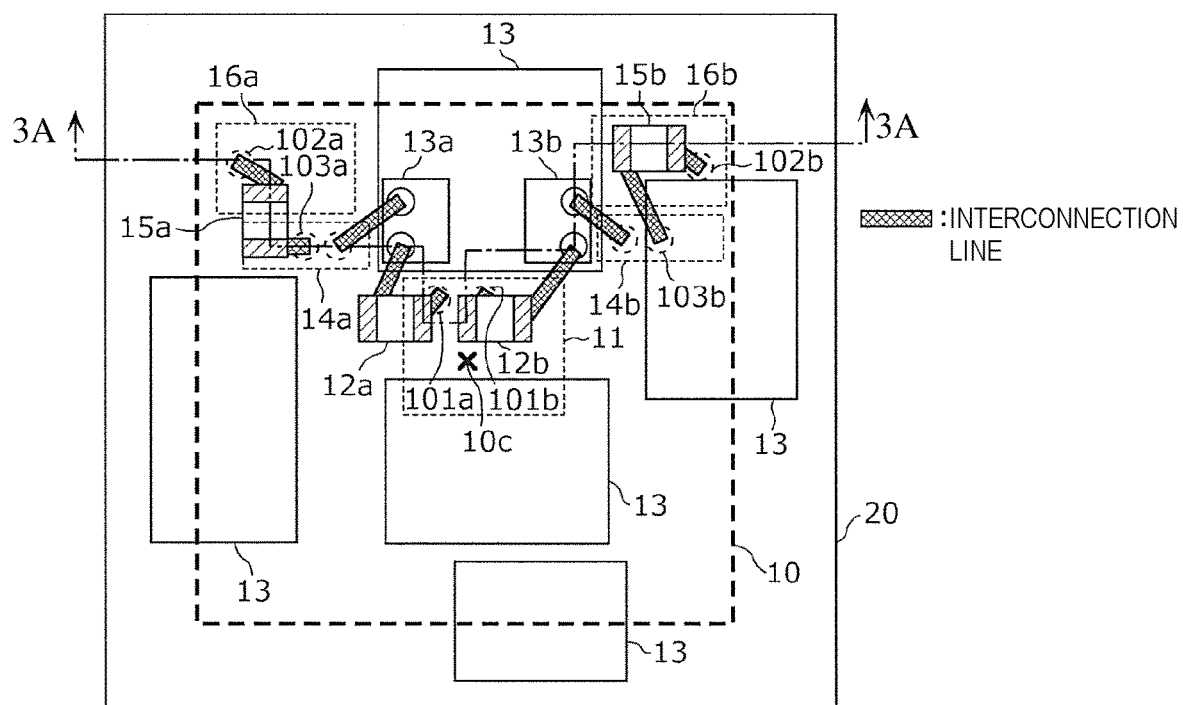
FIG. 2C is an exemplary plan view of the front-end module according to Embodiment 1 as seen from a second major side.

With reference to FIGS. 2A to 2C, the following describes the layout of individual components of the switching IC 10, and the configuration of first and second major sides of the front-end module 1.

FIG. 2A is an exemplary plan view of the front-end module 1 according to Embodiment 1 as seen from a first major side. FIG. 2B is an exemplary plan view of the front-end module 1 according to Embodiment 1, illustrating how the amplifier unit 16 of the front-end module 1 is positioned.

The first major side refers to, for example, the back side of a substrate 20, which is a component of the front-end module 1. The second major side refers to the front side of the substrate 20. The substrate 20 is, for example, a printed circuit board or a low temperature co-fired ceramics (LTCC) substrate. As will be described later, an interconnection pattern 22 and a via 24 (see FIGS. 3A to 3C) are provided inside the substrate 20 to connect the terminals (bumps) provided on the front and back sides of the substrate 20.

The back side of the substrate 20 is provided with the switching IC 10 and electrodes 50. Each electrode 50 is disposed on the back side of the substrate 20 around the switching IC 10. The electrode 50 may be a copper pillar (copper pin) electrode, a plated electrode, a copper paste electrode, or other such electrode, or solder. Although the switching IC 10 is sealed with resin 60, the resin is not illustrated in FIGS. 2A and 2B.

As illustrated in FIG. 2A, the switching IC 10 includes the first switching unit 11, the amplifier unit 16, and the second switching unit 17 that are disposed on a base 10a, which is a semiconductor substrate. The first switching unit 11, the amplifier unit 16, and the second switching unit 17 are, for example, incorporated in a package. The third switching unit 14 may be incorporated in the package.

The first switching unit 11 has, for example, a substantially rectangular shape. In a plan view of the switching IC 10, the first switching unit 11 is disposed in the vicinity of the central portion of the base 10a.

In a plan view, the amplifier unit 16 is positioned to surround three sides of the first switching unit 11. More specifically, as illustrated in FIG. 2B, the amplifier unit 16 includes a first region A, a second region B, and a third region C. The first region A extends along a first edge 111a of the four edges of the first switching unit 11. The second region B extends along a second edge 111b of the first switching unit 11, which is orthogonal to the first edge 111a. The third region C extends along a third edge 111c of the first switching unit 11, which is an edge parallel to the first edge 111a and orthogonal to the second edge 111b.

At least one of the amplifier circuits 16a to 16d of the amplifier unit 16 is disposed in each of the first, second, and third regions A, B, and C of the amplifier unit 16. For example, as illustrated in FIG. 2A, the amplifier circuit 16a and the amplifier circuit 16b are disposed in the first region A. The amplifier circuit 16a, the amplifier circuit 16b, and the amplifier circuit 16c are disposed in the second region B. The amplifier circuit 16c and the amplifier circuit 16d are disposed in the third region C.

Only at least one of the amplifier circuits 16a to 16d of the amplifier unit 16 needs to be disposed in each of the first, second, and third regions A, B, and C. In one exemplary configuration, as illustrated in FIG. 2B, the amplifier circuit 16a is disposed in the first region A, the amplifier circuits 16a and 16b are disposed in the second region B, and the amplifier circuit 16b is disposed in the third region C.

The amplifier unit 16 may not necessarily be positioned to surround the three sides of the first switching unit 11, but may be positioned to surround the four sides of the first switching unit 11.

For example, as illustrated in FIGS. 2A and 2B, in a plan view of the base 10a, the second switching unit 17 of the switching IC 10 is disposed closer to the peripheral edge of the base 10a than the amplifier unit 16. More specifically, at least one portion of the second switching unit 17 is disposed closer to the peripheral edge of the base 10a than the amplifier unit 16. The amplifier unit 16 is disposed between the at least one portion of the second switching unit 17, and the first switching unit 11. However, the second switching unit 17 may not necessarily be disposed in this manner.

FIG. 2C is an exemplary plan view of the front-end module 1 according to Embodiment 1 as seen from the second major side. In FIG. 2C, the solid lines indicate circuit elements disposed over the front side (second major side) of the substrate 20, and the dashed lines indicate the switching IC 10 disposed over the back side (first major side) of the substrate 20 and circuit elements constituting the switching IC 10.

Although individual interconnection lines connecting the circuit elements disposed over the front side of the substrate 20 and the corresponding circuit elements disposed over the back side of the substrate 20 are formed at the surface of or inside the substrate 20, each interconnection line is depicted in a simplified manner (i.e., in the shortest possible length) in FIG. 2C. Of the interconnection lines connecting individual circuit elements, FIG. 2C depicts only the interconnection lines constituting the signal path connecting the inductor 12a (first inductor), the filter 13a, the switch 14a, the inductor 15a, and the amplifier circuit 16a, and the interconnection lines constituting the signal path connecting the inductor 12b (second inductor), the filter 13b, the switch 14b, the inductor 15b, and the amplifier circuit 16b.

As illustrated in FIG. 2C, the following components are disposed over the front side of the substrate 20: the first matching circuit unit 12 (only the inductors 12a and 12b are illustrated in FIG. 2C), the filtering unit 13 (only the filters 13a and 13b are illustrated in FIG. 2C), and the second matching circuit unit 15 (only the inductors 15a and 15b are illustrated in FIG. 2C). Although the first matching circuit unit 12, the filtering unit 13, and the second matching circuit unit 15 are sealed with the resin 60, the resin 60 is not illustrated in FIG. 2C.

As illustrated in FIG. 2C, the inductor 12a, which is a first inductor, and the inductor 12b, which is a second inductor, are disposed adjacent to each other over the front side (second major side) of the substrate 20. Further, the inductor 12a may be mounted with its coil axis (not illustrated) being parallel to the substrate 20, and the inductor 12b may be mounted with its coil axis (not illustrated) being perpendicular to the substrate 20. This configuration makes it possible to reduce the electromagnetic coupling between the inductor 12a and the inductor 12b. As a result, the leaking-in of an undesired signal, the intermodulation distortion, or other problems caused by such electromagnetic coupling can be reduced. This helps reduce the degradation of the characteristics of the front-end module 1 such as noise figure.

The coil axis of an inductor means the axis described below. For an inductor in the form of a solenoid coil, the coil axis is the center axis of its winding (the main direction of magnetic flux generated in the winding). For an inductor in the form of a spiral coil, the coil axis is the axis passing through the center of the spiral coil and perpendicular to the plane in which the spiral coil is located.

As illustrated in FIG. 2C, in a plan view of the substrate 20, the switching IC 10 is positioned to overlap the first matching circuit unit 12 and a portion of the filtering unit 13. Further, in a plan view of the substrate 20, the switching IC 10 is positioned to overlap the second matching circuit unit 15. The filtering unit 13 as illustrated in FIG. 1 may be disposed in plural separate locations over the substrate 20 as illustrated in FIG. 2C. Although FIG. 1 depicts four inductors 15a to 15d, the number of inductors may be changed in accordance with the number of bands.

The resin 60 on the front side of the substrate 20, and the resin 60 on the back side of the substrate 20 may be the same or different kinds of resin. The resin 60 may cover the entirety of both sides of the substrate 20. Alternatively, for example, by using resin such as underfill resin as the resin 60, the resin 60 may seal only the switching IC 10 disposed over the back side of the substrate 20, or only one of the first matching circuit unit 12, the filtering unit 13, and the second matching circuit unit 15, which are disposed over the front side of the substrate 20.

Figure 3A:
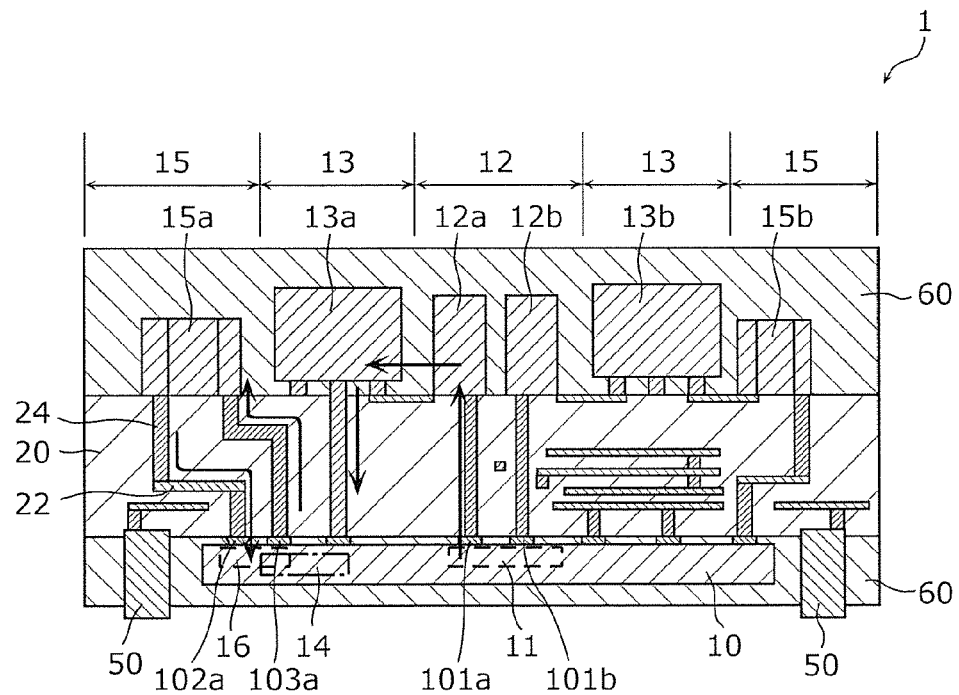
FIG. 3A is a cross-sectional view of the front-end module according to Embodiment 1.

The flow of a radio-frequency signal in the front-end module 1 will be described below. FIG. 3A is a cross-sectional view of the front-end module 1 according to Embodiment 1, taken along a line 3A-3A in FIG. 2C.

In Embodiment 1, a radio-frequency signal flows through the first switching unit 11, the first matching circuit unit 12, the filtering unit 13, the third switching unit 14, the second matching circuit unit 15, the amplifier unit 16, and the second switching unit 17 (not illustrated) in this order as indicated by the arrows in FIG. 3A.

For the switching IC 10 disposed over the back side of the substrate 20, in a plan view of the front side (second major side) of the substrate 20, the distance between the center 10c of the switching IC 10 and the first matching circuit unit 12 is shorter than the distance between the center 10c and the filtering unit 13, and the distance between the center 10c and the first matching circuit unit 12 is shorter than the distance between the center 10c and the second matching circuit unit 15.

As a result of the above-mentioned configuration, for the front-end module 1 in which a radio-frequency signal flows through the first switching unit 11, the first matching circuit unit 12, the filtering unit 13, the third switching unit 14, the second matching circuit unit 15, and the amplifier unit 16 in this order, the interconnection line connecting the first switching unit 11 with the first matching circuit unit 12, and the interconnection line connecting the second matching circuit unit 15 with the amplifier unit 16 can be shortened. Thus, a radio-frequency signal flows in the front-end module 1 such that on both the front and back sides of the substrate 20, the radio-frequency signal flows outward from the central portion of the substrate 20. This configuration makes it possible to reduce the path loss from the first switching unit 11 to the amplifier unit 16.

The flow of a radio-frequency signal will be described below in detail with attention directed to one of plural radio-frequency paths in the front-end module 1. The following describes a radio-frequency path that passes through the first switching unit 11, the first matching circuit unit 12, the filtering unit 13, the third switching unit 14, the second matching circuit unit 15, and the amplifier unit 16.

The front-end module 1 is mounted on, for example, a motherboard (not illustrated), and receives a radio-frequency signal from the motherboard via each electrode 50. The arrows in FIG. 3A indicate the flow of the radio-frequency signal in the front-end module 1. The radio-frequency signal flows to, for example, the switch 11b of the first switching unit 11 through an interconnection line (not illustrated) that connects the electrode 50 with the input terminal (bump) of the first switching unit 11. After passing through the switch 11b, the radio-frequency signal then flows to the inductors 12a and 12b respectively through an interconnection line connecting the corresponding output terminal (bump) of the switch 11b with an input terminal 101a of the inductor 12a of the first matching circuit unit 12, and an interconnection line connecting the corresponding output terminal of the switch 11b with an input terminal 101b of the inductor 12b of the first matching circuit unit 12. Each of the input terminals 101a and 101b is a first terminal disposed on a fourth major side, which is one of two opposite third and fourth major sides of the switching IC 10 that is closer to the front side (second major side) of the substrate 20 than the other.

After passing through the inductor 12a, the radio-frequency signal then flows to the filter 13a through an interconnection line connecting the output terminal of the inductor 12a with the input terminal of the filter 13a of the filtering unit 13. The radio-frequency signal is filtered in the filter 13a, and then flows to the switch 14a through an interconnection line connecting the output terminal of the filter 13a with the input terminal of the switch 14a of the third switching unit 14. After passing through the switch 14a, the radio-frequency signal then flows to the inductor 15a through an interconnection line that connects an output terminal 103a of the switch 14a with the input terminal of the inductor 15a of the second matching circuit unit 15. The output terminal 103a is a third terminal disposed on the fourth major side, which is one of the two opposite third and fourth major sides of the switching IC 10 that is closer to the front side (second major side) of the substrate 20 than the other.

After passing through the inductor 15a, the radio-frequency signal then flows to the amplifier circuit 16a, which is disposed over the back side of the substrate 20, through a via and an interconnection pattern that connect the output terminal of the inductor 15a with an input terminal 102a of the amplifier circuit 16a of the amplifier unit 16. The input terminal 102a is a second terminal disposed on the fourth major side, which is one of the two opposite third and fourth major sides of the switching IC 10 that is closer to the front side (second major side) of the substrate 20 than the other. The radio-frequency signal is amplified in the amplifier circuit 16a, and then flows to the second switching unit 17 through an interconnection line (not illustrated) that connects the output terminal (not illustrated) of the amplifier circuit 16a with the input terminal (not illustrated) of the second switching unit 17.

The input and output terminals of each individual circuit element mentioned above are, for example, metal bumps or metal electrodes.

As described above, a radio-frequency signal flows from the first switching unit 11 disposed over the back side of the substrate 20 to the filtering unit 13 disposed over the front side of the substrate 20. The radio-frequency signal then flows from the filtering unit 13 to the second matching circuit unit 15 via the third switching unit 14, and further flows to the amplifier unit 16 and the second switching unit 17, which are disposed over the back side of the substrate 20. Accordingly, the following interconnection lines are necessary: an interconnection line connecting the first switching unit 11 with the first matching circuit unit 12; an interconnection line connecting the first matching circuit unit 12 with the filtering unit 13; an interconnection line connecting the filtering unit 13 with the third switching unit 14; an interconnection line connecting the third switching unit 14 with the second matching circuit unit 15; and an interconnection line connecting the second matching circuit unit 15 with the amplifier unit 16.

On the back side of the substrate 20, the first switching unit 11 is disposed in the vicinity of the central portion of the back side in a plan view of the substrate 20. On the front side of the substrate 20, the first matching circuit unit 12 is disposed in the vicinity of the central portion of the front side in a plan view of the substrate 20. Thus, an interconnection line that connects the first switching unit 11 with the first matching circuit unit 12 can be placed by providing the via 24 inside the substrate 20. Consequently, the interconnection line connecting the first switching unit 11 with the first matching circuit unit 12 does not need to be routed onto the front and back sides of the substrate 20. This makes it possible to shorten the interconnection line to a length substantially equal to the thickness (e.g., about 0.2 to 0.3 mm) of the substrate 20.

In a plan view of the substrate 20, on the front side of the substrate 20, the filtering unit 13 is disposed substantially in the middle between the central portion of the substrate 20 and the peripheral edge of the substrate 20. On the back side of the substrate 20, the third switching unit 14 is disposed at a position in the switching IC 10 that is located substantially in the middle between the central portion of the switching IC 10 and the peripheral edge of the switching IC 10. In other words, the third switching unit 14 is disposed at a position over the substrate 20 closer to the peripheral edge of the substrate 20 than the first switching unit 11. This means that the interconnection line between the second matching circuit unit 15 and the amplifier unit 16 does not need to be routed over a long distance to the front and back sides of the substrate 20. Therefore, the interconnection line can be shortened to a length substantially equal to the thickness of the substrate 20.

On the front side of the substrate 20, the second matching circuit unit 15 is disposed at a position near the peripheral edge of the substrate 20 in a plan view of the substrate 20. On the back side of the substrate 20, the amplifier unit 16 is disposed at a position in the switching IC 10 near the peripheral edge of the switching IC 10. In other words, the amplifier unit 16 is disposed at a position over the substrate 20 closer to the peripheral edge of the substrate 20 than the first switching unit 11. This means that the interconnection line between the second matching circuit unit 15 and the amplifier unit 16 does not need to be routed over a long distance to the front and back sides of the substrate 20. The interconnection line can be thus shortened to a length substantially equal to the thickness of the substrate 20.

As illustrated in FIG. 3A, the first matching circuit unit 12, the filtering unit 13, and the second matching circuit unit 15 are disposed adjacent to each other over the front side of the substrate 20 in this order from the central portion of the substrate 20. Accordingly, the interconnection line connecting the first matching circuit unit 12 with the filtering unit 13, and the interconnection line connecting the filtering unit 13 with the second matching circuit unit 15 may only need to be disposed on the front side of the substrate 20. This makes it possible to shorten the interconnection line connecting the first matching circuit unit 12 with the filtering unit 13, and the interconnection line connecting the filtering unit 13 with the second matching circuit unit 15.

As illustrated in FIG. 2C, in a plan view of the fourth major side of the switching IC 10, the distance between the center 10c of the switching IC 10 and the input terminal 101a (first terminal) may be shorter than the distance between the center 10c and the input terminal 102a.

Consequently, the interconnection line connecting the first switching unit 11 with the first matching circuit unit 12 is disposed closer to the center 10c of the switching IC 10 than the interconnection line connecting the amplifier unit 16 with the second matching circuit unit 15. As a result, the above-mentioned two interconnection lines can be formed in the same manner as the flow of a radio-frequency signal from the first switching unit 11 to the amplifier unit 16. The two interconnection lines can be thus shortened. Further, the above-mentioned configuration makes it possible to eliminate the crossing of the two interconnection lines in the above-mentioned plan view, thus minimizing the parasitic capacitance formed by the two interconnection lines.

As illustrated in FIG. 2C, in a plan view of the fourth major side of the switching IC 10, the distance between the center 10c of the switching IC 10 and the output terminal 103a (third terminal) may be shorter than the distance between the center 10c and the input terminal 102a.

Consequently, the interconnection line connecting the third switching unit 14 with the second matching circuit unit 15 is disposed closer to the center 10c of the switching IC 10 than the interconnection line connecting the amplifier unit 16 with the second matching circuit unit 15. As a result, the above-mentioned two interconnection lines can be formed in the same manner as the flow of a radio-frequency signal from the first switching unit 11 to the amplifier unit 16. The two interconnection lines can be thus shortened. Further, the above-mentioned configuration makes it possible to eliminate the crossing of the two interconnection lines in the above-mentioned plan view, thus minimizing the parasitic capacitance formed by the two interconnection lines.

Figure 2D:
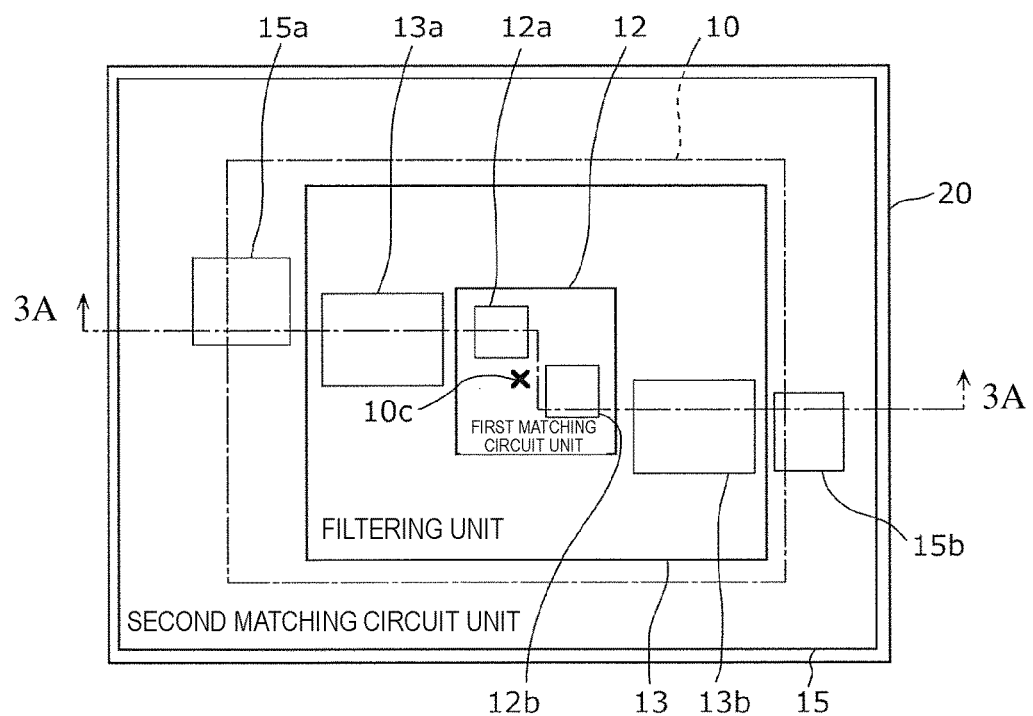
FIG. 2D is an exemplary plan view of a front-end module according to Modification 1 of Embodiment 1 as seen from the second major side.

FIG. 2D is a plan view of a front-end module according to Modification 1 of Embodiment 1 as seen from the second major side.

As illustrated in FIG. 2D, the front side (second major side) of the substrate 20 is provided with the first matching circuit unit 12, the filtering unit 13, and the second matching circuit unit 15. Although the first matching circuit unit 12, the filtering unit 13, and the second matching circuit unit 15 are sealed with the resin 60, the resin 60 is not illustrated in FIG. 2D. In FIG. 2D, the solid lines indicate the inductors 12a and 12b, the filters 13a and 13b, and the inductors 15a and 15b, which are disposed over the front side of the substrate 20, and the alternate long and short dash lines indicate the switching IC 10, which is disposed over the back side (first major side) of the substrate 20.

As illustrated in FIG. 2D, in a plan view of the substrate 20, the switching IC 10 is positioned to overlap the first matching circuit unit 12 and the filtering unit 13. Further, in a plan view of the substrate 20, the switching IC 10 is positioned to overlap a portion of the second matching circuit unit 15. The filtering unit 13 as illustrated in FIG. 1 may be disposed in two separate locations over the substrate 20 as illustrated in FIG. 2D. Although FIG. 1 depicts four inductors 15a to 15d, the number of inductors may be changed in accordance with the number of frequency bands.

For the front-end module according to Modification 1, as with the front-end module 1 according to Embodiment 1, in a plan view of the front side (second major side) of the substrate 20, the distance between the center 10c of the switching IC 10 and the first matching circuit unit 12 is shorter than the distance between the center 10c and the filtering unit 13, and the distance between the center 10c and the first matching circuit unit 12 is shorter than the distance between the center 10c and the second matching circuit unit 15. In addition, for the front-end module according to Modification 1, in a plan view of the front side (second major side) of the substrate 20, the distance between the center 10c and the filtering unit 13 may be shorter than the distance between the center 10c and the second matching circuit unit 15.

Consequently, in the front-end module according to Modification 1, in the above-mentioned plan view, the first matching circuit unit 12, the filtering unit 13, and the second matching circuit unit 15 are disposed in this order from a position corresponding to the center 10c of the switching IC 10. Therefore, as compared with the front-end module 1 according to Embodiment 1, the interconnection line connecting the second matching circuit unit 15 with the amplifier unit 16 can be further shortened.

3. Advantageous Effects etc.

The configuration of the switching IC 10 according to Embodiment 1 described above has the effect described below. For the switching IC 10 in which a radio-frequency signal flows through the first switching unit 11, the third switching unit 14, the amplifier unit 16, and the second switching unit 17 in this order, if the first switching unit 11 and the third switching unit 14 are to be connected via some other component (the first matching circuit unit 12 and the filtering unit 13), and the third switching unit 14 and the amplifier unit 16 are to be connected via some other component (the second matching circuit unit 15), the interconnection line connecting the first switching unit 11 with the first matching circuit unit 12, the interconnection line connecting the filtering unit 13 with the third switching unit 14, and the interconnection line connecting the second matching circuit unit 15 with the amplifier unit 16 can be shortened. This helps reduce the path loss from the first switching unit 11 to the second switching unit 17 in the front-end module 1.

Further, each individual interconnection line placed between the first switching unit 11 and the second switching unit 17 can be shortened. This can simplify the routing of individual interconnection lines, thus facilitating a design such that the interconnection lines for individual radio-frequency paths do not overlap in a plan view of the substrate 20. This leads to improved isolation characteristics of the front-end module 1.

4. Modifications 4-1. Modification 2

Figure 3B:
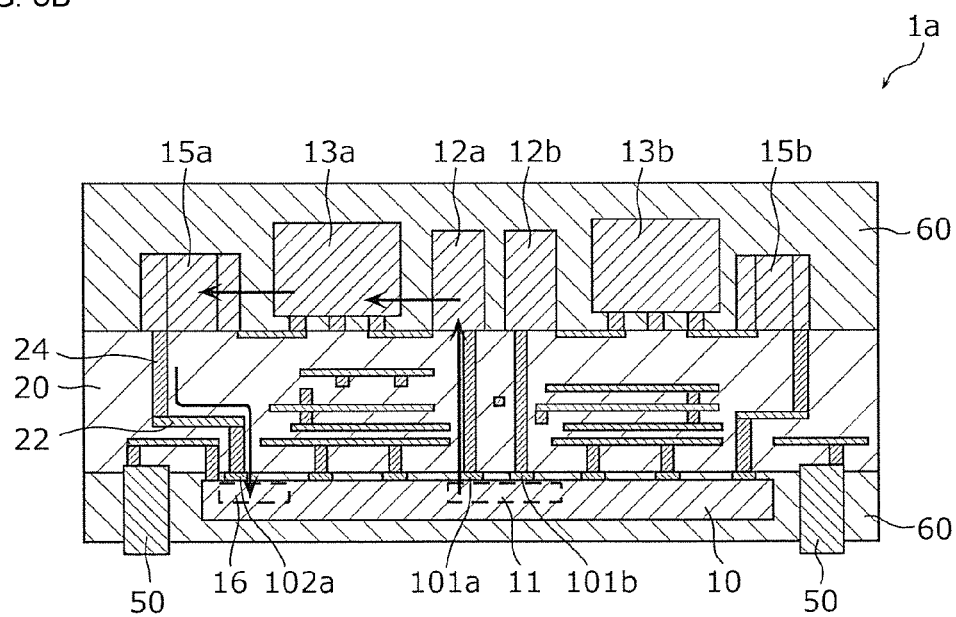
FIG. 3B is a cross-sectional view of a front-end module according to Modification 2 of Embodiment 1.

In the foregoing description of the front-end module 1, the switching IC 10 includes the third switching unit 14. In an alternative configuration, the switching IC 10 may not include the third switching unit 14 as illustrated in FIG. 3B. FIG. 3B is a cross-sectional view of a front-end module 1a according to Modification 2 of Embodiment 1. The positions where the interconnection pattern 22 and the via 24 are disposed in FIG. 3B are illustrative only.

In the front-end module 1a, a radio-frequency signal flows through the first switching unit 11, the first matching circuit unit 12, the filtering unit 13, the second matching circuit unit 15, the amplifier unit 16, and the second switching unit 17 (not illustrated) in this order as indicated by the arrows in FIG. 3B.

The above-mentioned configuration of the front-end module 1a makes it possible to shorten the interconnection line between the first switching unit 11 and the first matching circuit unit 12, and the interconnection line between the second matching circuit unit 15 and the amplifier unit 16. This helps reduce the path loss from the first switching unit 11 to the second switching unit 17 in the front-end module 1a.

4-2. Modification 3

Figure 3C:
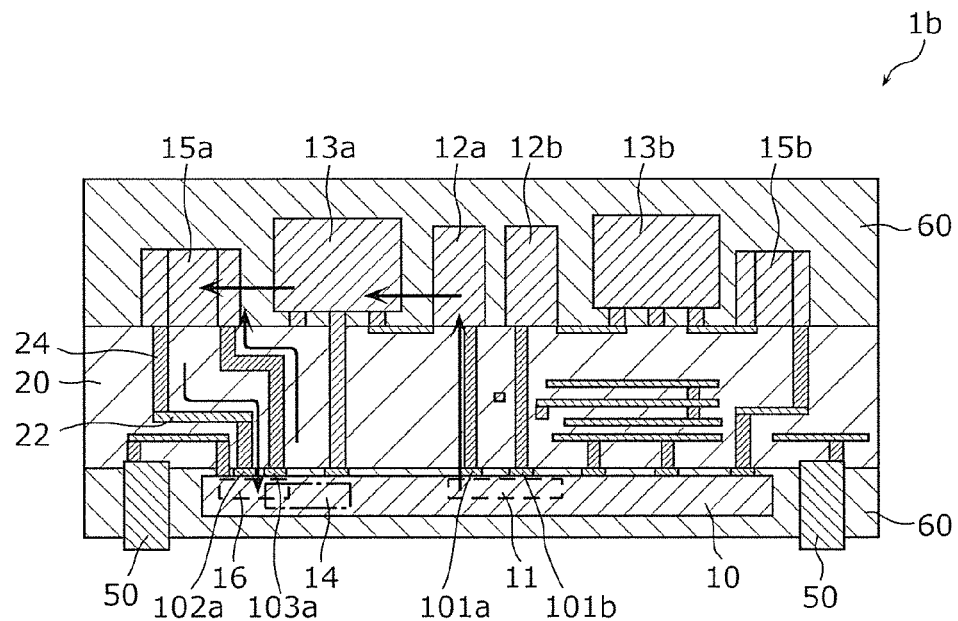
FIG. 3C is a cross-sectional view of a front-end module according to Modification 3 of Embodiment 1.

In the foregoing description of the front-end module 1, the switching IC 10 includes the second switching unit 17. In an alternative configuration, the switching IC 10 may not include the second switching unit 17 as illustrated in FIG. 3C. FIG. 3C is a cross-sectional view of a front-end module 1b according to Modification 3 of Embodiment 1. The positions where the interconnection pattern 22 and the via 24 are disposed in FIG. 3C are illustrative only.

In the front-end module 1b, a radio-frequency signal flows through the first switching unit 11, the first matching circuit unit 12, the filtering unit 13, the third switching unit 14, the second matching circuit unit 15, the amplifier unit 16, and the electrode 50 in this order as indicated by the arrows in FIG. 3C.

The above-mentioned configuration of the front-end module 1b makes it possible to shorten the interconnection line between the first switching unit 11 and the first matching circuit unit 12, and the interconnection line between the second matching circuit unit 15 and the amplifier unit 16. This helps reduce the path loss from the first switching unit 11 to the amplifier unit 16 in the front-end module 1b.

4-3. Modification 4

Figure 4:
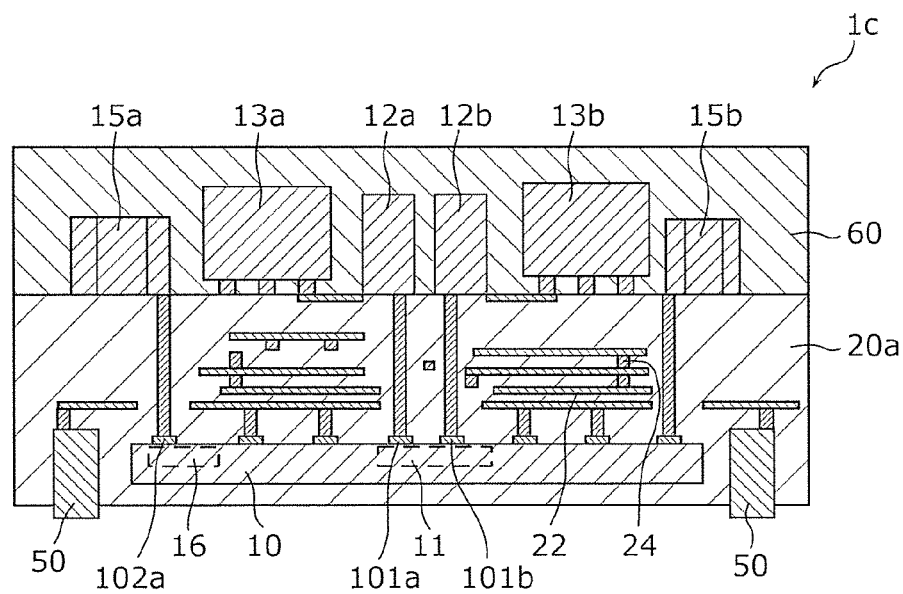
FIG. 4 is a cross-sectional view of a front-end module according to Modification 4 of Embodiment 1.

In the front-end module 1 described above, the switching IC 10 is disposed over one major side (e.g., back side) of the substrate 20. In an alternative configuration, the switching IC 10 may be disposed inside a substrate 20a as illustrated in FIG. 4. FIG. 4 is a cross-sectional view of a front-end module 1c according to Modification 4 of Embodiment 1. The positions where the interconnection pattern 22 and the via 24 are disposed in FIG. 4 are illustrative only.

For cases in which the switching IC 10 is incorporated in the substrate 20a, the substrate 20a may be a printed circuit board that allows for easy machining to incorporate the switching IC 10 into the substrate 20a. The front-end module 1c is identical in function to the front-end module 1 and thus will not be described in further detail.

Embodiment 2

Figure 5:
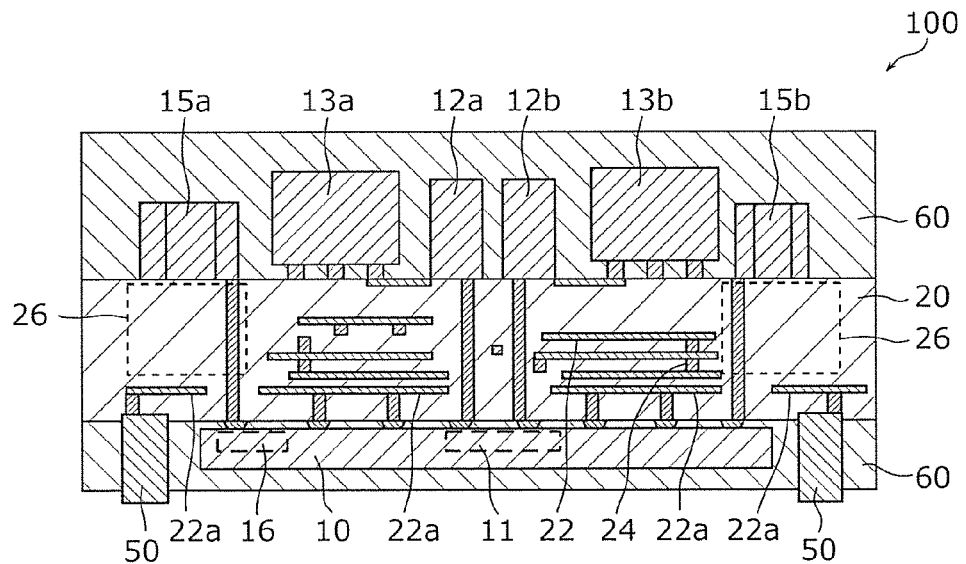
FIG. 5 is a cross-sectional view of a front-end module according to Embodiment 2.

FIG. 5 is a cross-sectional view of a front-end module 100 according to Embodiment 2.

The front-end module 100 according to Embodiment 2 differs from the front-end module 1 according to Embodiment 1 in that a ground pattern connected to ground is not disposed at a position inside the substrate 20 under the second matching circuit unit 15. A ground pattern refers to, among interconnection patterns inside the substrate 20, an interconnection pattern having a ground potential and connected to one of the electrodes 50 that serves as a ground terminal.

As illustrated in FIG. 5, a ground pattern 22a is the interconnection pattern inside the substrate 20 that is positioned closest to the back side of the substrate 20. The ground pattern 22a is connected to one of the electrodes 50 serving as a ground terminal.

The ground pattern 22a is not disposed at a position inside the substrate 20 under each of the inductors 15a and 15b, but is disposed at a position inside the substrate 20 other than under each of the inductors 15a and 15b. More specifically, the ground pattern 22a is not disposed at a position under the inductors 15a and 15b, at least within a region 26 corresponding to substantially one-half of the thickness of the substrate 20 from the front side of the substrate 20.

Consequently, in the area under the second matching circuit unit 15 connected to the amplifier unit 16, the parasitic capacitance that forms between the land of an inductor and the ground pattern 22a disposed inside the substrate 20 can be reduced. The influence of phase shift and interconnection impedance can be thus reduced for a radio-frequency signal inputted to the amplifier unit 16. This makes it possible to reduce the degradation of the characteristics of the amplifier circuits (e.g., low-noise amplifiers) 16a to 16d disposed in the amplifier unit 16.

Embodiment 3

Figure 6A:
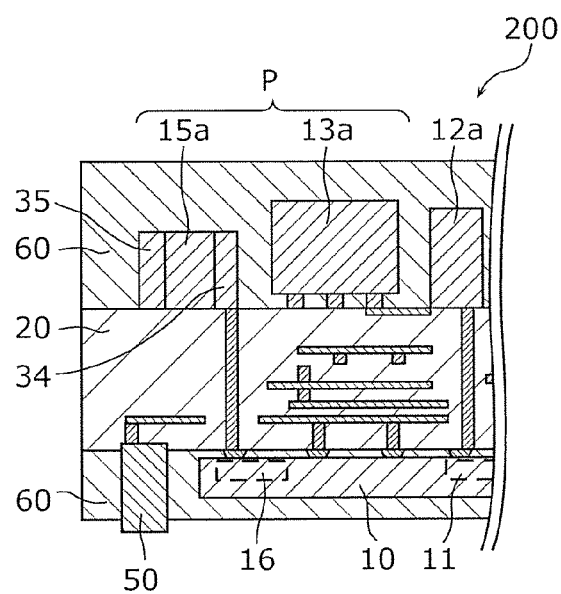
FIG. 6A is a cross-sectional view of a front-end module according to Embodiment 3.
Figure 6B:
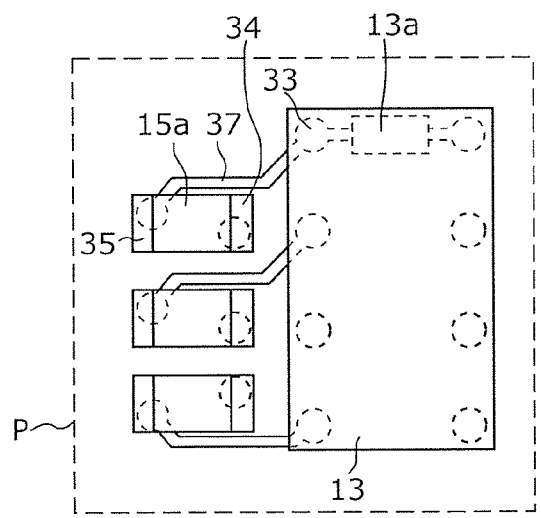
FIG. 6B is a plan view of the front-end module according to Embodiment 3, illustrating how a filter and an inductor are connected.

FIG. 6A is a cross-sectional view of a front-end module 200 according to Embodiment 3. FIG. 6B is a plan view of the front-end module 200 according to Embodiment 3, illustrating how the filter 13a and the inductor 15a are connected. FIG. 6B is a plan view of a region P illustrated in FIG. 6A.

The front-end module 200 according to Embodiment 3 differs from the front-end module 1 according to Embodiment 1 in the routing of the interconnection lines connecting the inductors 15a to 15d of the second matching circuit unit 15 with the filter 13a. The front-end module 200 does not include the switch 14a. In Embodiment 3, the inductor 15a will be described as an example of the second matching circuit unit 15, and the filter 13a will be described as an example of the filtering unit 13.

As illustrated in FIGS. 6A and 6B, the inductor 15a and the filter 13a are disposed adjacent to each other. The inductor 15a has a first electrode 34 at its side near the filter 13a, and has a second electrode 35 at a position farther from the filter 13a than the first electrode 34. The second electrode 35 is connected to a terminal 33 of the filter 13a. The first electrode 34 is connected by the via 24, which is placed in the substrate 20, to the amplifier unit 16 provided to the switching IC 10 disposed over the back side of the substrate 20.

As described above, of the two electrodes of the inductor 15a, the second electrode 35 located farther from the filter 13a than the other is connected to the terminal 33 of the filter 13a. With this configuration, although the interconnection line between the second electrode 35 and the terminal 33 increases in length, the first electrode 34 is located at a shorter distance to the switching IC 10, which is disposed over the back side of the substrate 20, than the second electrode 35. This configuration makes it possible to shorten the interconnection line connecting the inductor 15a with the amplifier unit 16 provided to the switching IC 10. Therefore, the parasitic capacitance in the interconnection line between the amplifier unit 16 and the second matching circuit unit 15 can be reduced. The influence of phase shift and interconnection impedance can be thus reduced for a radio-frequency signal inputted to the amplifier unit 16. This helps further reduce the degradation of the characteristics of the amplifier circuits (e.g., low-noise amplifiers) 16a to 16d disposed in the amplifier unit 16. Further, if the first electrode 34 and the amplifier unit 16 overlap in a plan view of the substrate 20, the first electrode 34 and the amplifier unit 16 can be connected by the via 24. The length of the interconnection line between the first electrode 34 and the amplifier unit 16 can be thus minimized.

The first electrode 34 of the inductor 15a, and the amplifier unit 16 provided to the switching IC 10 may be connected by the via 24, or may be connected by, in addition to the via, the interconnection pattern 22 disposed on the front side, back side, or inside the substrate 20.

Embodiment 4

Figure 7A:
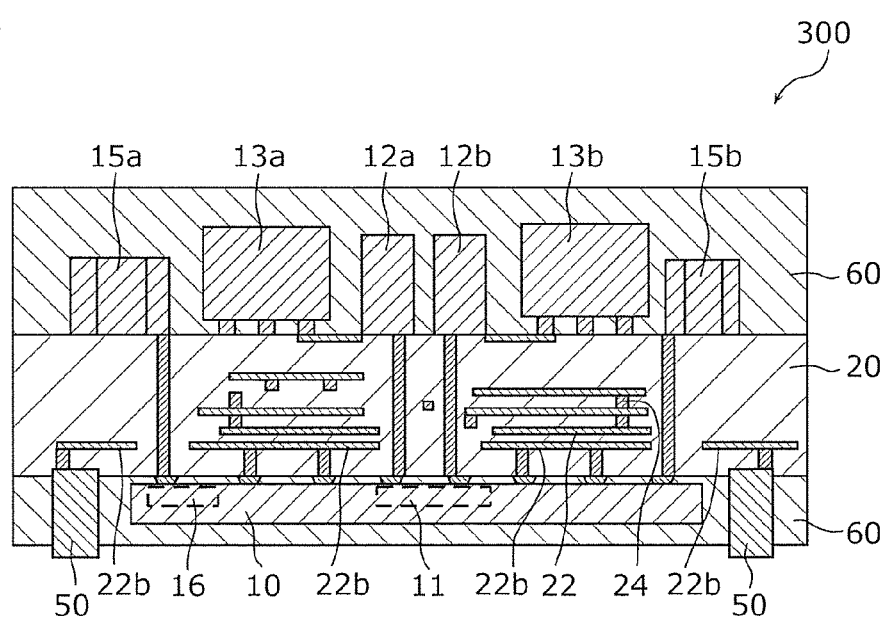
FIG. 7A is a cross-sectional view of a front-end module according to Embodiment 4.

FIG. 7A is a cross-sectional view of a front-end module 300 according to Embodiment 4. The front-end module 300 according to Embodiment 4 differs from the front-end module 1 according to Embodiment 1 in that analog circuit components that use an analog signal, and digital circuit components that use an digital signal are disposed separately over the front and back sides of the substrate 20.

As illustrated in FIG. 7A, in the front-end module 300, the inductors 12a and 12b, the filters 13a and 13b, and the inductors 15a and 15b are disposed over the front side of the substrate 20. The inductors 12a and 12b, the filters 13a and 13b, and the inductors 15a and 15b are analog circuit components.

In the front-end module 300, the switching IC 10 as a digital circuit component is disposed over the back side of the substrate 20. Further, the following components disposed in the switching IC 10 are digital circuit components: the switches 11a to 11c of the first switching unit 11; the switches 17a to 17g of the second switching unit 17; and the amplifier circuits 16a to 16d of the amplifier unit 16. Although not illustrated, the switches 14a to 14d of the third switching unit 14 are also digital circuit components, and thus may be disposed over the back side of the substrate 20.

Thus, the digital and analog circuit components are separately disposed respectively on the back and front sides of the substrate 20. This means that the analog and digital circuit components are spaced apart from each other by at least a distance substantially equal to the thickness of the substrate 20. This configuration helps prevent the digital noise generated by a digital circuit component from leaking into an analog circuit component.

As illustrated in FIG. 7A, a ground pattern 22b may be disposed inside the substrate 20. Due to the presence of the ground pattern 22b inside the substrate 20, analog and digital circuit components disposed separately over the front and back sides of the substrate 20 are isolated from each other by the ground pattern 22b. This configuration allows digital noise to readily flow to the reference ground, thus preventing the digital noise from leaking into an analog circuit component. Further, the ground used for analog circuit components, and the ground used for digital circuit components are connected only via the ground at the closest point of the electrode 50 located closest to the reference ground. This configuration helps further prevent the digital noise generated by a digital circuit component from leaking into an analog circuit component.

Figure 7B:
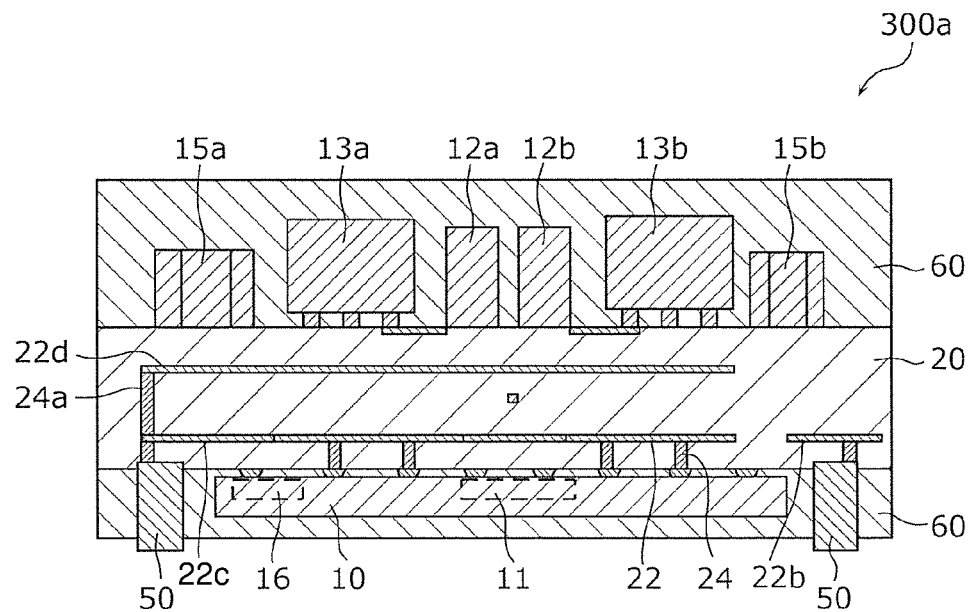
FIG. 7B is a cross-sectional view of a front-end module according to a modification of Embodiment 4.

If ground patterns are to be disposed inside the substrate 20, a ground pattern 22c used for digital circuit components, and a ground pattern 22d used for analog circuit components may be disposed. FIG. 7B is a cross-sectional view of a front-end module 300a according to a modification of Embodiment 4.

As illustrated in FIG. 7B, in the front-end module 300a, the ground pattern 22c used for digital circuit components is disposed at a position inside the substrate 20 near the back side where the switching IC 10 is disposed. The ground pattern 22d used for analog circuit components is disposed at a position inside the substrate 20 near the front side where the inductors 12a and 12b, the filters 13a and 13b, and the inductors 15a and 15b are disposed. The ground pattern 22c used for digital circuit components is a second ground pattern, and the ground pattern 22d used for analog circuit components is a first ground pattern.

As illustrated in FIG. 7B, the ground pattern 22c used for digital circuit components, and the ground pattern 22d used for analog circuit components are connected only by a via 24a, which is a conductor. The via 24a is connected to the electrode 50. The electrode 50 is connected to the reference ground. In other words, the ground pattern 22c used for digital circuit components, and the ground pattern 22d used for analog circuit components are connected only by the electrode 50, which is a ground terminal connected to the reference ground. The ground pattern 22c used for digital circuit components is thus positioned close to the reference ground. This configuration ensures that the digital noise generated by a digital circuit component flows to the reference ground, rather than leaking to the ground pattern 22d used for analog circuit components. This helps further prevent the digital noise generated by a digital circuit component from leaking into an analog circuit component.

Embodiment 5

Figure 8A:
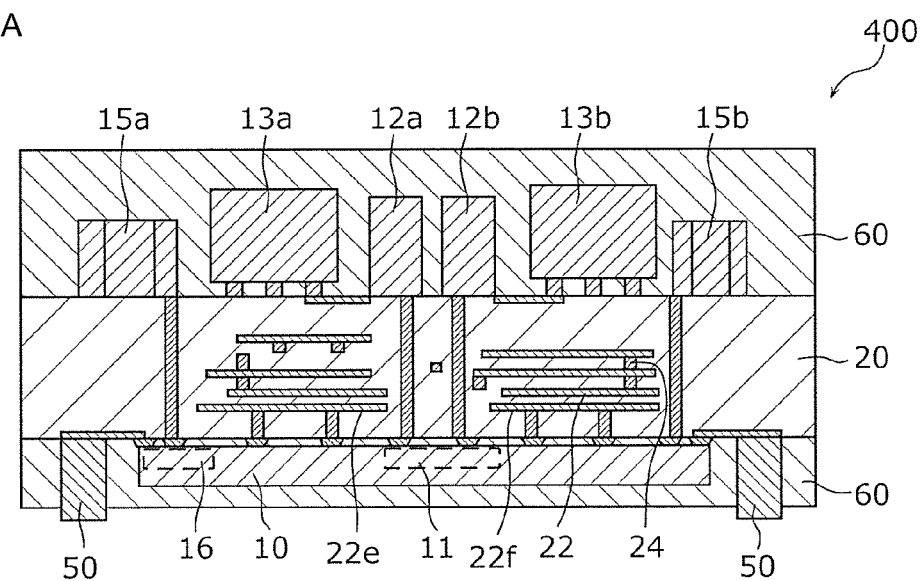
FIG. 8A is a cross-sectional view of a front-end module according to Embodiment 5.
Figure 8B:
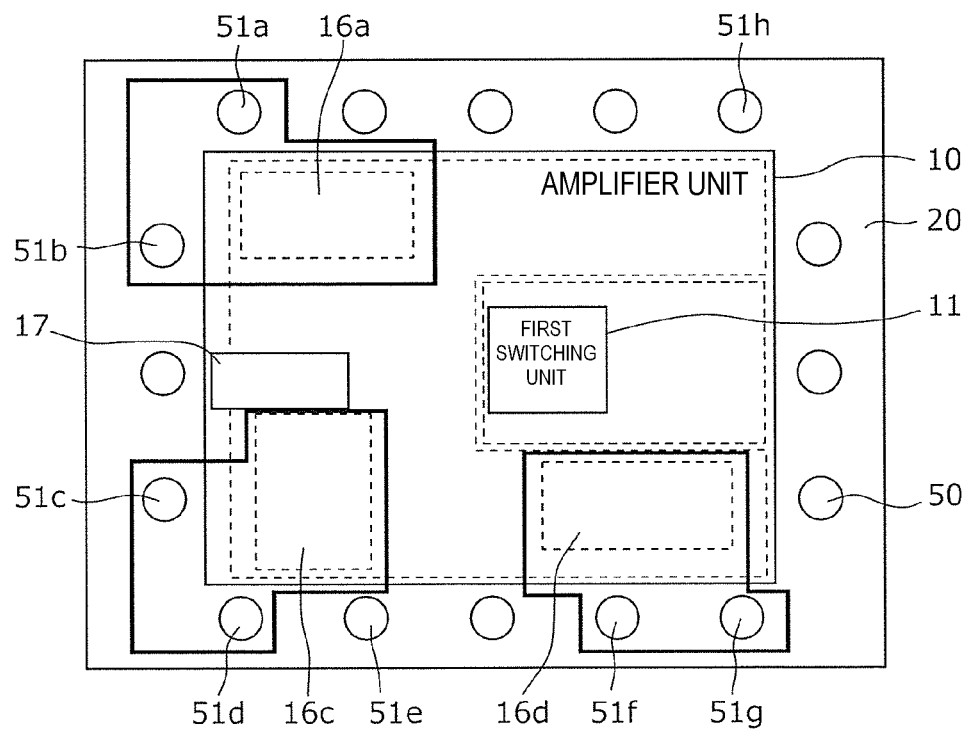
FIG. 8B is a plan view of the front-end module according to Embodiment 5.

FIG. 8A is a cross-sectional view of a front-end module 400 according to Embodiment 5. FIG. 8B is a plan view of the front-end module according to Embodiment 5. The front-end module 400 according to Embodiment 5 differs from the front-end module 300 according to Embodiment 4 in that the amplifier circuits 16a to 16d are connected to different independent grounds. The amplifier circuit 16b is not depicted in FIG. 8B.

As illustrated in FIG. 8A, the switching IC 10 is disposed over the back side of the substrate 20. The switching IC 10 is connected only by conductors connected to ground patterns 22e and 22f disposed near the back side of the substrate 20. The ground patterns 22e and 22f are different ground patterns. Each of the ground patterns 22e and 22f represents the interconnection pattern located closest to the back side of the substrate 20 and connected to the ground terminal. The ground patterns 22e and 22f are thus ground patterns with strong grounding property that is insusceptible to the influence of noise.

Each of the amplifier circuits 16a to 16d is connected to a different one of ground patterns connected to plural ground electrodes 51a to 51h. For example, as indicated by a thick line in FIG. 8B, the amplifier circuit 16a is connected to a ground pattern connected to the ground electrodes 51a and 51b located close to the amplifier circuit 16a. The amplifier circuit 16c is connected to a ground pattern connected to the ground electrodes 51c and 51d located close to the amplifier circuit 16c. The amplifier circuit 16d is connected to a ground pattern connected to the ground electrodes 51f and 51g located close to the amplifier circuit 16d.

As described above, the ground patterns for different amplifier circuits 16a to 16d are separated from each other. This configuration helps ensure that, for the amplifier circuits 16a to 16d through which radio-frequency signals in different frequency bands pass, a radio-frequency signal in one frequency band does not leak into an amplifier circuit in another frequency band. This makes it possible to reduce the degradation of the noise characteristics of the amplifier circuits 16a to 16d. More specifically, for the front-end module 400 that sends and receives radio-frequency signals simultaneously in plural band classes (frequency ranges), such as in carrier aggregation, if two or more low-noise amplifiers (LNAs) are operating simultaneously, the above-mentioned configuration helps prevent a radio-frequency signal in one band from leaking into a circuit in another band. This makes it possible to reduce the degradation of the noise characteristics of the front-end module 400.

Embodiment 6

The switching IC 10 and the front-end module 1 described above with reference to each of Embodiments 1 to 5 can be applied to a communication apparatus.

Figure 9:
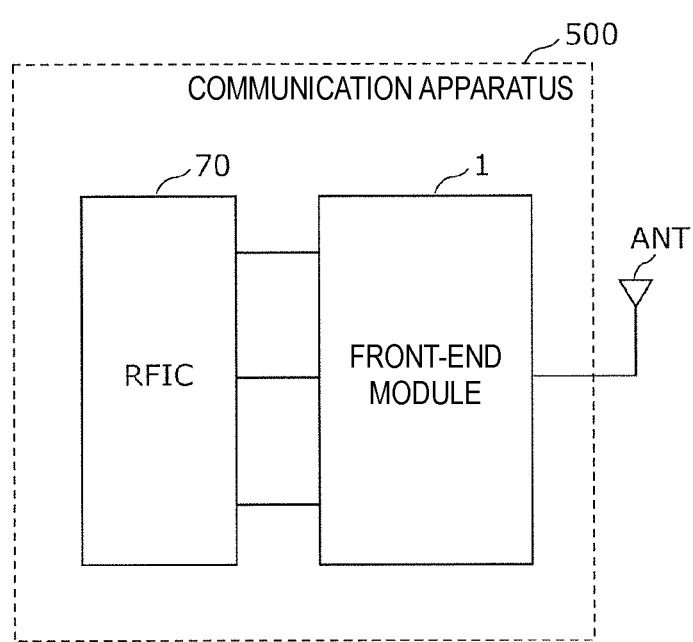
FIG. 9 is a diagram of a communication apparatus according to Embodiment 6.

FIG. 9 is a diagram of a communication apparatus 500 according to Embodiment 6. FIG. 9 illustrates the front-end module 1, an antenna element ANT, and a radio-frequency integrated circuit (RFIC) 70. The front-end module 1 and the RFIC 70 constitute the communication apparatus 500. The antenna element ANT, the front-end module 1, and the RFIC 70 are disposed at, for example, the front-end section of a cellular phone capable of multimode/multiband operation.

The antenna element ANT is a multiband-capable antenna compliant with, for example, the LTE or other communication standards and used to send and receive a radio-frequency signal. The antenna element ANT may be incorporated in the communication apparatus 500.

The front-end module 1 is a circuit that transmits a radio-frequency signal between the antenna element ANT and the RFIC 70. More specifically, the front-end module 1 transmits a radio-frequency signal received by the antenna element ANT to the RFIC 70 via a receiving-side signal path.

The RFIC 70 is a radio-frequency integrated circuit that processes a radio-frequency signal sent and received by the antenna element ANT. More specifically, the RFIC 70 applies signal processing such as down conversion to a radio-frequency signal inputted to the RFIC 70 from the antenna element ANT through the receiving-side signal path of the front-end module 1, and outputs a receive signal generated by the signal processing to a baseband integrated circuit (not illustrated).

The presence of the front-end module 1 (switching IC 10) in the communication apparatus 500 makes it possible to provide the communication apparatus 500 with improved isolation characteristics and reduced path loss.

Although the communication apparatus 500 according to Embodiment 6 includes the front-end module 1 in the above-mentioned example, the communication apparatus 500 may include the front-end module 1a, 200, 300, or 400.

Other Embodiments

Although the switching IC, the front-end module, and the communication apparatus according to various embodiments of the present disclosure have been described above by way of Embodiments 1 to 6, the present disclosure is not limited to the above embodiments. The present disclosure is intended to also encompass other embodiments achieved by combining given components in the above embodiments, and modifications obtained by modifying the above embodiments in various ways as may become apparent to one skilled in the art without departing from the scope of the present disclosure.

For example, although the above embodiments are directed to the case in which the first matching circuit unit 12, the filtering unit 13, and the second matching circuit unit 15 are disposed over the first major side (e.g., front side) of the substrate 20, these units may be disposed inside the substrate 20.

Further, for example, the number of components constituting each individual unit depicted in FIG. 1, such as the number of switches constituting the first switching unit 11, the number of switches constituting the second switching unit 17, the number of amplifier circuits constituting the amplifier unit 16, the number of filters constituting the filtering unit 13, the number of inductors constituting the first matching circuit unit 12, or the number of inductors constituting the second matching circuit unit 15, is illustrative only, and not limited to the number depicted in FIG. 1.

The present disclosure can be used for a wide variety of communication equipment such as cellular phones, as a front-end module and a communication apparatus that are applicable to a multiband system.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
a base;
a first switching unit disposed on the base, the first switching unit having a substantially rectangular shape and including a plurality of first switches; and
an amplifier unit disposed on the base, the amplifier unit including a plurality of amplifier circuits to which a radio-frequency signal is inputted after passing through the first switching unit,
wherein in a plan view of the base, the amplifier unit surrounds three sides of the first switching unit.

2. A radio-frequency circuit comprising:
a substrate having a first major side and a second major side;
a semiconductor device comprising:
  a base;
  a first switching unit disposed on the base, the first switching unit having a substantially rectangular shape and including a plurality of first switches; and
  an amplifier unit disposed on the base, the amplifier unit including a plurality of amplifier circuits to which a radio-frequency signal is inputted after passing through the first switching unit,
wherein in a plan view of the base, the first switching unit has four edges including a first edge, a second edge orthogonal to the first edge, and a third edge parallel to the first edge and orthogonal to the second edge, the amplifier unit includes a first region extending along the first edge, a second region extending along the second region, and a third region extending along the third edge, and at least one of the plurality of amplifier circuits is disposed in each of the first region, the second region, and the third region, the semiconductor device being disposed over the first major side of the substrate or inside the substrate;
a first matching circuit unit disposed over the second major side of the substrate, the first matching circuit unit including a plurality of first matching circuits;
a filtering unit disposed at a position over the second major side of the substrate and closer to an outer side portion of the substrate than the first matching circuit unit in a plan view, the filtering unit including at least one filter; and
a second matching circuit unit disposed at a position over the second major side of the substrate and closer to the outer side portion of the substrate than the filtering unit in a plan view, the second matching circuit unit including at least one second matching circuit,
wherein the radio-frequency signal passes through the first switching unit, the first matching circuit unit, the filtering unit, the second matching circuit unit, and the amplifier unit in this order, and
wherein in a plan view of the second major side, a distance between a center of the semiconductor device and the first matching circuit unit is shorter than a distance between the center of the semiconductor device and the filtering unit, and the distance between the center of the semiconductor device and the first matching circuit unit is shorter than a distance between the center of the semiconductor device and the second matching circuit unit.

3. The radio-frequency circuit according to claim 2,
wherein in a plan view of the second major side, the distance between the center of the semiconductor device and the filtering unit is shorter than the distance between the center of the semiconductor device and the second matching circuit unit.

4. The radio-frequency circuit according to claim 2,
wherein the semiconductor device includes
  a third major side and a fourth major side, the third and fourth major sides being parallel to the second major side and opposite to each other, the fourth major side being closer to the second major side than the third major side, and
  a first terminal and a second terminal, the first terminal and the second terminal being disposed on the fourth major side,
wherein the first terminal is connected to the first switching unit, and connected to the first matching circuit unit,
wherein the second terminal is connected to the amplifier unit, and connected to the second matching circuit unit, and
wherein in a plan view of the fourth major side, a distance between the center of the semiconductor device and the first terminal is shorter than a distance between the center of the semiconductor device and the second terminal.

5. The radio-frequency circuit according to claim 4,
wherein the semiconductor device further includes
  a second switching unit disposed on the base, the second switching unit including a plurality of second switches to which the radio-frequency signal is inputted after passing through the amplifier unit,
  a third switching unit disposed on the base, the third switching unit including a plurality of third switches to which the radio-frequency signal is inputted after passing through the filtering unit, the plurality of third switches each outputting the inputted radio-frequency signal to the second matching circuit unit, and
  a third terminal disposed on the fourth major side,
wherein the third terminal is connected to the third switching unit, and connected to the second matching circuit unit, and
wherein in a plan view of the fourth major side, a distance between the center of the semiconductor device and the third terminal is shorter than the distance between the center of the semiconductor device and the second terminal.

6. The radio-frequency circuit according to claim 2,
wherein a ground pattern is disposed inside the substrate, and
wherein the ground pattern is positioned to overlap the second matching circuit unit in a plan view, and is not disposed within a region located closer to the second major side than a position corresponding to substantially one-half of a thickness of the substrate.

7. The radio-frequency circuit according to claim 2,
wherein the second matching circuit unit includes a first electrode and a second electrode, the second electrode being located farther from the filter than the first electrode, and
wherein the second electrode is connected to the filter.

8. The radio-frequency circuit according to claim 2,
wherein among the first switching unit, the first matching circuit unit, the filtering unit, the second matching circuit unit, and the amplifier unit,
the first matching circuit unit, the filtering unit, and the second matching circuit unit are disposed over the second major side, and
the first switching unit, and the amplifier unit are disposed over the first major side.

9. The radio-frequency circuit according to claim 2,
wherein the first matching circuit unit includes a first inductor and a second inductor,
wherein the first inductor and the second inductor are disposed adjacent to each other over the second major side,
wherein the first inductor is mounted over the second major side with a coil axis of the first inductor being parallel to the second major side, and
wherein the second inductor is mounted over the second major side with a coil axis of the second inductor being perpendicular to the second major side.

10. The radio-frequency circuit according to claim 2,
wherein the semiconductor device includes a digital circuit component,
wherein the substrate includes
a first ground pattern to which an analog circuit component is connected, and
a second ground pattern to which the digital circuit component is connected, and
wherein the first ground pattern and the second ground pattern are connected only by a conductor connected to a ground terminal.

11. The radio-frequency circuit according to claim 2,
wherein the substrate includes a plurality of ground patterns, the plurality of ground patterns being connected only by a conductor connected to a ground terminal, and
wherein each of the plurality of amplifier circuits is connected to a different one of the plurality of ground patterns.

12. A communication apparatus comprising:
a radio-frequency integrated circuit that configured to process a radio-frequency signal sent and received by an antenna element; and
the radio-frequency circuit according to claim 2, the radio-frequency circuit transmitting the radio-frequency signal between the antenna element and the radio-frequency integrated circuit.

13. The radio-frequency circuit according to claim 3,
wherein the semiconductor device includes
a third major side and a fourth major side, the third and fourth major sides being parallel to the second major side and opposite to each other, the fourth major side being closer to the second major side than the third major side, and
a first terminal and a second terminal, the first terminal and the second terminal being disposed on the fourth major side,
wherein the first terminal is connected to the first switching unit, and connected to the first matching circuit unit,
wherein the second terminal is connected to the amplifier unit, and connected to the second matching circuit unit, and
wherein in a plan view of the fourth major side, a distance between the center of the semiconductor device and the first terminal is shorter than a distance between the center of the semiconductor device and the second terminal.

14. The radio-frequency circuit according to claim 3,
wherein a ground pattern is disposed inside the substrate, and
wherein the ground pattern is positioned to overlap the second matching circuit unit in a plan view, and is not disposed within a region located closer to the second major side than a position corresponding to substantially one-half of a thickness of the substrate.

15. The radio-frequency circuit according to claim 4,
wherein a ground pattern is disposed inside the substrate, and
wherein the ground pattern is positioned to overlap the second matching circuit unit in a plan view, and is not disposed within a region located closer to the second major side than a position corresponding to substantially one-half of a thickness of the substrate.

16. The radio-frequency circuit according to claim 5,
wherein a ground pattern is disposed inside the substrate, and
wherein the ground pattern is positioned to overlap the second matching circuit unit in a plan view, and is not disposed within a region located closer to the second major side than a position corresponding to substantially one-half of a thickness of the substrate.

17. The radio-frequency circuit according to claim 3,
wherein the second matching circuit unit includes a first electrode and a second electrode, the second electrode being located farther from the filter than the first electrode, and
wherein the second electrode is connected to the filter.

18. The radio-frequency circuit according to claim 4,
wherein the second matching circuit unit includes a first electrode and a second electrode, the second electrode being located farther from the filter than the first electrode, and
wherein the second electrode is connected to the filter.

19. The radio-frequency circuit according to claim 5,
wherein the second matching circuit unit includes a first electrode and a second electrode, the second electrode being located farther from the filter than the first electrode, and
wherein the second electrode is connected to the filter.

20. The radio-frequency circuit according to claim 6,
wherein the second matching circuit unit includes a first electrode and a second electrode, the second electrode being located farther from the filter than the first electrode, and
wherein the second electrode is connected to the filter.

* * * * *